United States Patent [19]

Kawakatsu

[11] Patent Number: 4,731,341

[45] Date of Patent: Mar. 15, 1988

[54] METHOD OF FABRICATING BIPOLAR SEMICONDUCTOR INTEGRATED CIRCUIT DEVICE

[75] Inventor: Akira Kawakatsu, Tokyo, Japan

[73] Assignee: Oki Electric Industrial, Co., Ltd., Tokyo, Japan

[21] Appl. No.: 913,303

[22] Filed: Sep. 30, 1986

[30] Foreign Application Priority Data

Oct. 2, 1985 [JP] Japan .................................. 60-218069

[51] Int. Cl.$^4$ .................. H01L 21/265; H01L 21/385
[52] U.S. Cl. ......................................... 437/31; 437/33; 437/69; 437/147; 437/160; 437/909; 437/DIG. 1; 357/34
[58] Field of Search .................... 29/576 B, 578, 580; 148/1.5, 175, 187; 357/34; 437/31

[56] References Cited

U.S. PATENT DOCUMENTS

| | | | |
|---|---|---|---|
| 4,337,115 | 6/1982 | Ikeda et al. | 29/580 |
| 4,417,385 | 11/1983 | Temple | 29/571 |
| 4,481,706 | 11/1984 | Roche | 29/577 C |
| 4,545,114 | 10/1985 | Ito et al. | 29/576 B |
| 4,590,666 | 5/1986 | Goto | 29/578 |
| 4,614,416 | 2/1987 | Iranmanesh et al. | 29/576 B |
| 4,640,721 | 2/1987 | Uehara et al. | 29/576 B |

OTHER PUBLICATIONS

"High Speed Bipolar ICs Using Super Self-Aligned Process Technology", by Tetsushi Sakai et al., Japanese Journal of Applied Physics, Vol. 20, (1981), Supplement 20-1, pp. 155-159.

"Deep UV Resist, LMR, for Lift-Off Technique", by Takaharu Kozu et al., The Electronic Communication Academic Institute Bulletin, SSD 83-178, pp. 1 to 8.

Primary Examiner—Upendra Roy
Attorney, Agent, or Firm—Wenderoth, Lind & Ponack

[57] ABSTRACT

An improved bipolar semiconductor integrated circuit device which has a reduced base resistance and a reduced parasitic capacitance can be provided with a small number of manufacturing steps.

A two-layered film composed of both a thin oxide film and a nitride film is formed on the surface of an impurity doped layer of a first conductivity type which is formed on a semiconductor substrate. A resist layer having an overhanging cross section is formed on a selected surface of the two-layered film. A high melting metal is deposited on the surface of the structure obtained by the above step in such manner that the metal does not cover the surface of the nitride film under the overhanging portion of the resist layer. The two-layered film under the overhanging portion of the resist layer is selectively removed to expose the surface of the impurity doped layer. A semiconductor material is deposited on an entire surface of the structure obtained by the above step, the semiconductor material being deposited under the overhanging portion of the resist layer. The resist layer is exposed to expose the surface of the nitride film.

Impurities of a second conductivity type are then implanted into the semiconducting material, the surface of the semiconductor oxidized, and impurities are diffused from the semiconductor material later to form a diffused region in said impurity doped layer. The exposed nitride and oxide films are then removed and a semiconductor material layer containing said first conductivity type impurities is formed on the exposed surface of the impurity doped layer.

6 Claims, 16 Drawing Figures

METHOD OF FABRICATING BIPOLAR SEMICONDUCTOR INTEGRATED CIRCUIT DEVICE

BACKGROUND OF THE INVENTION

1. Field of the Invention

The present invention relates to a method for fabricating bipolar semiconductor integrated circuit device which is adopted for high integration and high density, and is capable of operating at high speed.

2. Description of the Related Art

In order to increase the operational speed of a bipolar semiconductor integrated circuit device, it is necessary to decrease the base resistance and the parasitic, especially base-collector junction capacitance of the transistor element formed therein. The base resistance can be reduced by forming a small sized emitter region to decrease an active base resistance and by placing an inactive base region as close as possible to an emitter region. Also, in order to decrease the base-collector junction capacitance, it is desired to reduce the areas of active and inactive base regions, thus reducing the junction area between the base and collector regions.

To achieve this requirements, some bipolar IC manufacturing methods which employ various self-alignment techniques allowing a high accuracy photoengraving processing have been proposed. For example, one of the prior art methods is disclosed in a paper entitled "High Speed Bipolar ICs Using Super Self-Aligned Process Technology" authorized by Tetsushi Sakai, et al., in the "Japanese Journal of Applied Physics, Volume 20 (1981) Supplement 20-1, pp. 155–159.

The prior art bipolar semiconductor IC device manufacturing process is described herewith with reference to FIGS. 1(a) to 1(h).

In FIG. 1(a), a P-type silicon substrate is prepared which has an N-type buried diffusion layer 2, an N-type epitaxial layer 3 acting a collector region, a P-type element isolation region 4 and an N-type collector contact region 5. Then, multilayers of thermal oxide (SiO$_2$) film 6, CVD Si$_3$N$_4$ film 7, CVDSiO2 film 8, boron-doped polysilicon and CVD Si$_3$N$_4$ film 10 are in turn formed on the surface of the silicon substrate. Then, the CVD nitride film 10 is partially removed by a photoengraving process to expose the surface of the polysilicon layer 10.

Next, as shown in FIG. 1(b), unnecessary parts of the polysilicon layer 9 are converted into SiO$_2$ film 11 by a thermal oxidation process. Then, Si$_3$N$_4$ film 10 is partially preserved at the areas corresponding to the base contact window and resistor window.

Next, as shown in FIG. 1(c), the windows for the emitter and the collector are opened by using a photoengraving process. Then a CVD oxide film 8 is side etched.

In FIG. 1(d), an aluminum layer 12 is formed on the entire surface of the structure but under the overhung portion of the polysilicon layer 9 by vacuum evaporation process.

Next, as shown in FIG. 1(e), the nitride film 7 under the overhung portion is completely removed by using the aluminum layer 12 as an etching mask and then boron ions are implanted into the exposed surface of the layer 3 to form an active base region 13 after the removal of the remaining aluminum layer. After the remaining oxide layer 6 is removed to expose the surface of the layer 3, an boron-doped polysilicon layer 9a is deposited over the entire surface of the structure.

In FIG. 1(f), the polysilicon layer 9a is selectively removed by ion milling so as to leave the polysilicon layer 9a under the overhung portion of the polysilicon layer 9.

Next, as shown in FIG. 1(g), the structure is subjected to an oxidation process to form a relatively thick oxide film 14 on the surface of polysilicon layer 9a, while an inactive base region 15 is formed by boron diffusion from the polysilicon 9b. In this step, the nitride films 9 and 10 prevent the oxidation of the polysilicon film 9 thereunder.

Next, as shown in FIG. 1(h), the remaining nitride films 7 and 10 and the thin oxide film 6 are etched off to form the windows for electrodes. Then, both boron-doped polysilicon emitter and collector electrodes 16a and 16b are formed in the windows. An emitter region 17 is formed by impurity diffusion from the polysilicon electrode 16a. Finally, metal electrodes 18 are formed on the surfaces of the polysilicon films 9.

However, the prior art bipolar IC manufacturing process is very complicated. In addition, since it is difficult to reduce the emitter area, there is a limit to further decrease the active base resistance content. The polysilicon base electrode according to the prior art makes it difficult to obtain a further lowered base resistance. Furthermore, it is difficult to further reduce the inactive area, and a side-etching process is employed on the nitride film.

SUMMARY OF THE INVENTION

It is therefore an object of the present invention to provide a method of fabricating a bipolar semiconductor integrated circuit device which has a reduced emitter area and which provides a reduced base resistance and a reduced base-collector junction capacitance. It is another object of the present invention to provide an improved method of fabricating a high density bipolar integrated circuit device with a small number of manufacturing steps.

According to the present invention, both an evapolated silicon layer and a high melting metal layer thereon are shaped by a lift-off processing which uses a resist layer having an overhanging cross section to form a policide layer for a base electrode. Also, according to the present invention, since the step of side-etching a CVD material layer is not used, it is possible to accurately form fined base regions within a pattern transferred by a photoengraving process.

According to the present invention, a method of fabricating bipolar semiconductor integrated circuit device comprises the steps of forming a two layered film composed of both a thin oxide film and a nitride film on the surface of an impurity doped layer of a first conductivity type which is formed on a semiconductor substrate; forming a resist layer on a selected surface of the two-layered film, which resist layer has an overhanging cross section; depositing a high melting metal on the surface of the structure obtained by the above step in the manner that the metal does not cover the surface of the nitride film under the overhanging portion of the resist layer; selectively removing the two-layered film under the overhanging portion of the resist layer to expose the surface of the impurity doped layer; depositing a semiconductor material on the surface of the structure obtained by the above step, the semiconductor material being deposited under the overhanging portion of the resist; removing the resist layer to expose the surface of the nitride film implanting impurities of a second conductivity type into said semiconductor material; oxidizing said semiconductor material layer to convert the surface of said semiconductor material layer into an oxide layer; diffusing impurities from said semiconductor material layer to form a diffused region in said impurity doped layer; removing said exposed nitride and oxide films to expose the surface of said impurity doped layer; and forming a semiconductor material layer containing said first conductivity type impurities on said exposed surface of said impurity doped layer.

DETAILED DESCRIPTION OF THE PREFERRED EMBODIMENT

An embodiment of the present invention is described in more detail with reference to the attached drawings. FIGS. 2(a) to 2(h) are views showing a process of fabricating a bipolar semiconductor circuit device according to the present invention.

Figure 1A:
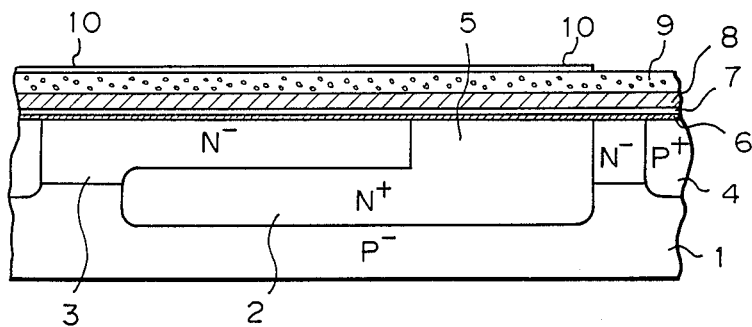
FIGS. 1(a) to 1(h) are cross sections showing a conventional process of fabricating a bipolar semiconductor circuit device.
Figure 1B:
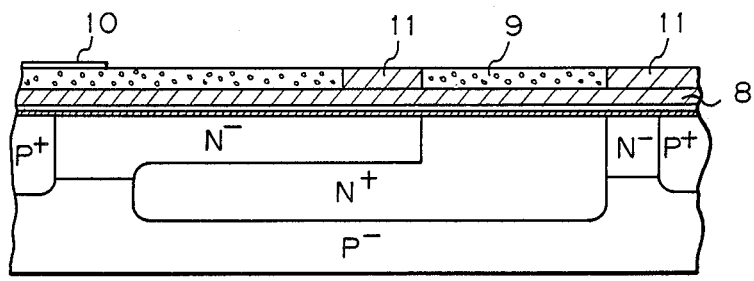
Figure 1C:
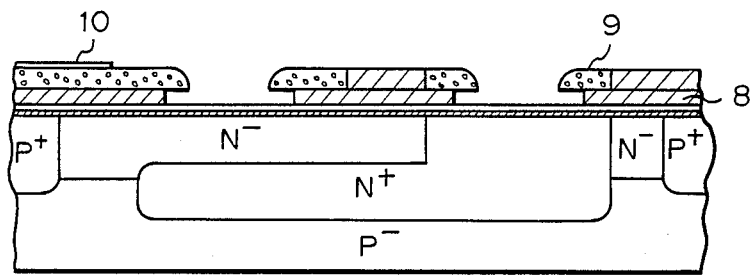
Figure 1D:
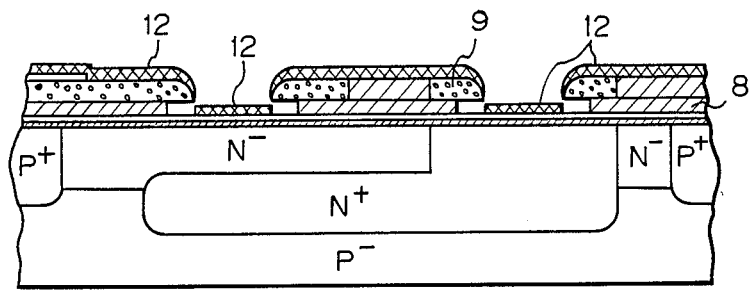
Figure 1E:
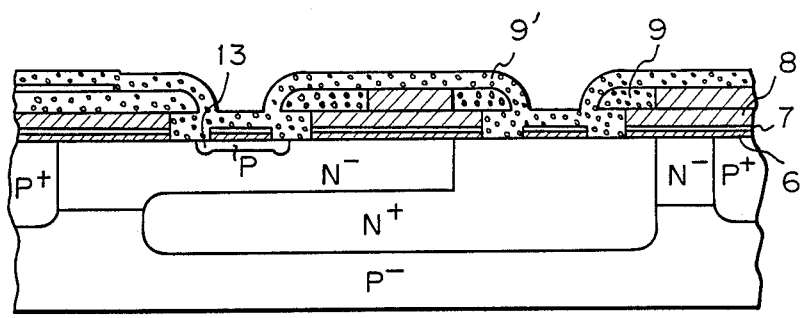
Figure 1F:
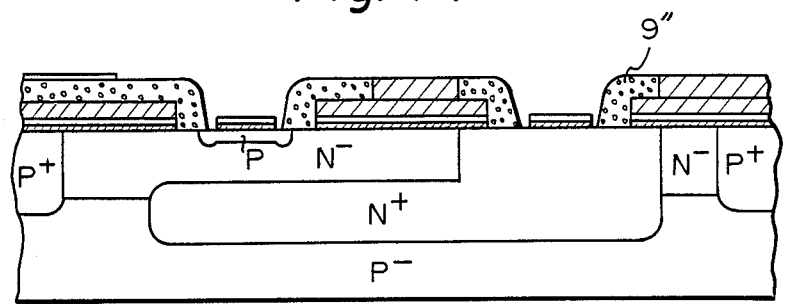
Figure 1G:
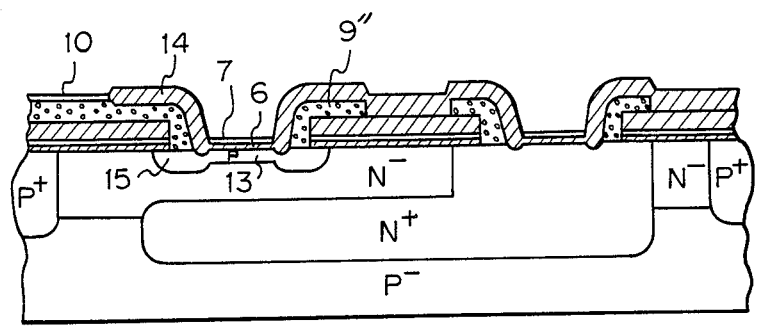
Figure 1H:
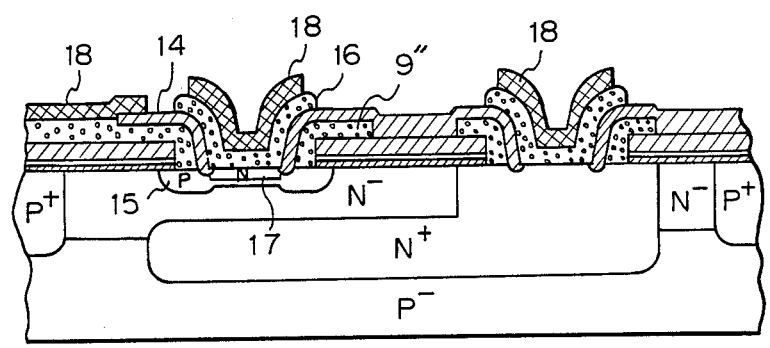
Figure 2A:
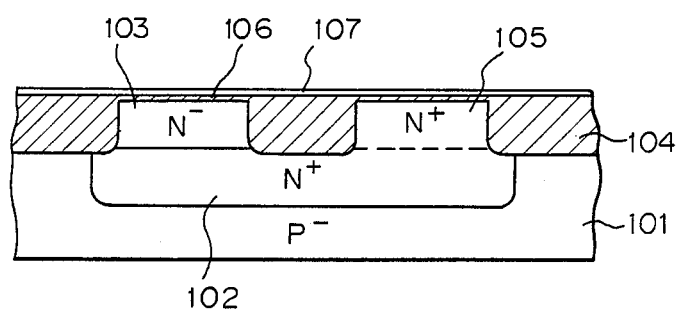
FIGS. 2(a) to 2(h) are cross sections showing an improved process according to the present invention of fabricating a bipolar semiconductor integrated circuit device.

As shown in FIG. 2(a), a P$^-$-type silicon semiconductor substrate 101 is prepared, which has an N$^+$-type buried diffusion layer 102 in the surface thereof. An N$^-$-type epitaxial layer 103 is formed over the surface of the silicon substrate 101. Then, the epitaxial layer is selectively oxidized to form element isolation regions 104 surrounding an collector region 103 and a collector contact region 105. The silicon substrate is subjected to an oxidation process to form a thin silicon oxide film 106 having a thickness of 100 to 500 Å on the surface of the epitaxial layer. Then, a silicon nitride film 107 having a thickness of 500 to 2000 Å is formed over the surface of the oxide film 106 by chemical vapor deposition process.

Figure 2B:
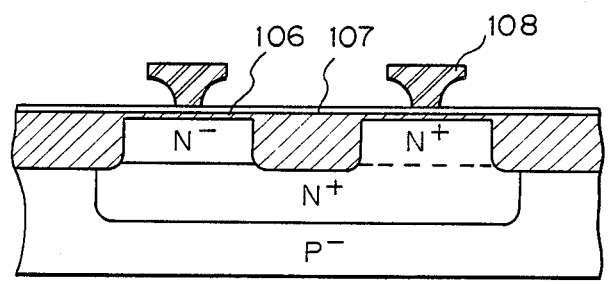

Next, as shown in FIG. 2(b), a negative photoresist layer having a thickness of 0.5 to 1.0 μm is formed over the surface of the silicon nitride film 107 by using a spinner. The photoresist material which can sense far ultraviolet rays is preferably used in this step. This photoresist can change its properties only at the upper surface thereof, while remaining unchanged at the lower portion thereof. This type of photoresist is described in a paper "Deep UV Resist, LMR, for Lift-off Technique" written by Takaharu Kozu, et al., in "The Electronic Communication Academic Institute Bulletin", SSD 83-178, pages 1 to 8.

The photoresist layer is subjected to a photolithography to form the tapered resist regions 108 of an overhanging cross-section at a selected surface of the layer 107 over the collector regions 103 at a selected surface of the layer 107 over the collector region 103 and the collector contact region 105. In this step, the overhanging portion can be controlled by the development processing time.

Figure 2C:
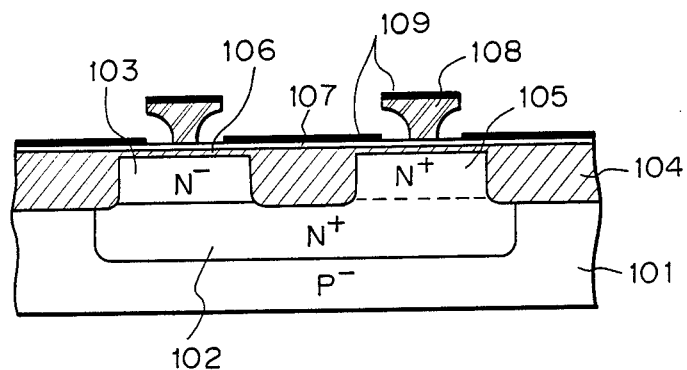

Next, as shown in FIG. 2(c), a high melting metal, for ex. molybdenum, tungsten, tantalum, layer 109 is deposited all over the surface of the structure obtained by the above step. The metal layer 108 is 300 to 500 Å in thickness, for example. In this step, the exposed silicon nitride film 107 under the overhanging portion of the resist region 108 is not covered by the metal layer.

Figure 2D:
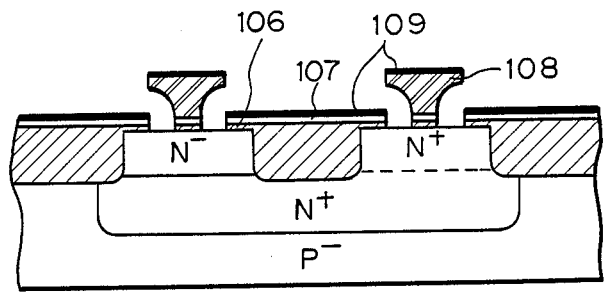

In FIG. 2(d), the exposed silicon nitride layer 107 is removed by dry etching process and then the exposed silicon oxide layer 106 is removed by wet etching process to expose predetermined surfaces of both the collector region 108 and the collector contact region 105.

Figure 2E:
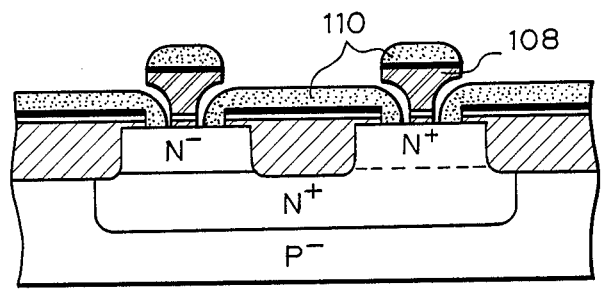

Next, a silicon layer 110 having a thickness of 2000 to 5000 Å is formed on the entire surface of the structure by using a sputtering process, as shown in FIG. 2(e). The silicon layer 110 is in amorphous state. In this step, with an appropriate control of the sputtering conditions, the silicon layer is deposited under the overhanging portion of the resist region 108. Then, boron ions are implanted in the silicon layer at a dose amount of $10^{15}$ to $10^{16}$ cm$^{-2}$.

Figure 2F:
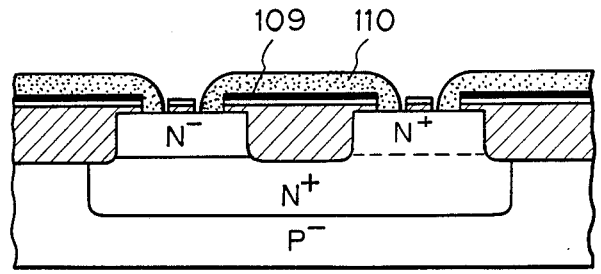

Next, as shown in FIG. 2(f), the structure obtained by the above step is immersed in an organic solution such as acetone to lift off the resist layer 108, whereby the silicon nitride layer 107 is exposed. Then, the structure is subjected to a thermal processing in a N$_2$ atmosphere of at a temperature of 500° to 600° C. to react the silicon layer 110 with the high melting metal layer 109, thus converting into a silicide layer 109a.

Figure 2G:
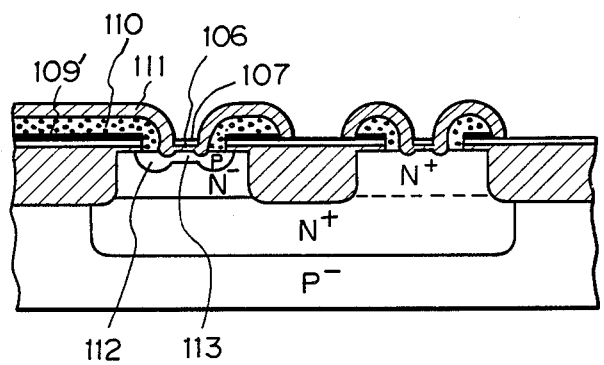

Then, as shown in FIG. 2(g), the undesirable portions of both the silicon layer 110 and the metal layer 109 over the surface of the element isolation regions 104 are selectively removed by a photolithographic process. Thereafter, the structure is heated in an oxidation atmosphere of 900° to 1000° C. to form a thermally grown silicon oxide layer 111 having a thickness of 1000 to 3000 Å, and the silicon layer 110 is polycrystallized amorphous state. At the same time, boron ions contained in the silicon layer 110 are diffused into the collector region 103 to form an inactive base region 112. After boron ions at a dose amount of $10^{13}$ to $10^{14}$ cm$^{-2}$ are implanted into the surface of the collector region 103 through both the silicon nitride film 107 and the silicon oxide film 106, the structure is annealed in an inactive atmosphere, ex. nitrogen, to form an active base region 113. In this step, the structure shown in FIG. 2(e) may be formed in the manner that after undesired portions of the silicon layer 110 are selectively removed, a thin silicon oxide layer is thermally grown on the surface of the silicon layer 110, then, boron ions are implanted into the surface of the collector region to form an active base region 113, and then the thin silicon oxide layer is reheated in an oxidation atmosphere to convert into a thick silicon oxide film.

Figure 2H:
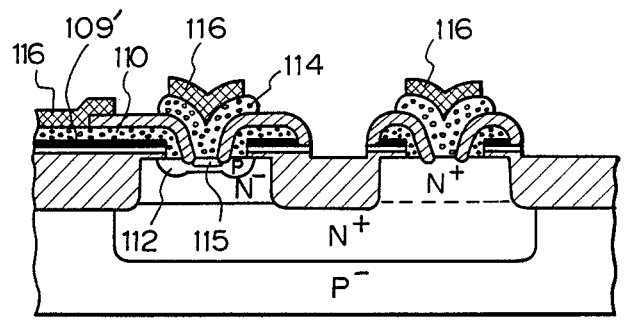

Next, as shown in FIG. 2(h), an arsenic-doped polycrystalline silicon layer is formed over the surface of the structure by chemical vapor deposition, and then it is selectively patterned to form both an emitter electrode 114a and an collector electrode 114b. The structure is heated to diffuse arsenic impurities into the surface of the active base region 113, thus forming an emitter region 115. Finally, a metal layer, ex. aluminum layer is vapored over the surface of the structure, and then it is patterned to form metal electrodes 116 for the base, emitter and collector electrode, respectively.

The embodiment above may be applied to a method of manufacturing a bipolar semiconductor integrated circuit device having PN junction element isolation regions.

According to this invention, the following advantages will be achieved:

(1) It is possible to reduce the number of fabrication steps for a bipolar semiconductor IC device. Though the conventional method requires six steps to form thin material films by a CVD or vapor evaporation process, the improved method according to this invention requires only three steps.

(2) It is possible to form a bipolar transistor region having a low base resistance, since the use of the policide base electrode can remarkably reduce its base resistance from about $100\Omega/\square$ to several $\Omega/\square$. Also, according to this invention, a shrunk emitter region can be accurately formed by controlling the overhanging portion of the tapered resist region.

(3) Furthermore, according to this invention, it is possible to make a high speed bipolar semiconductor IC device since the base-collector junction capacitance can be greatly decreased.

Although the invention has been described in the preferred embodiment, it should be understood that many variations and changes in the invention are possible without departing from the scope and spirit thereof.

What is claimed is:

1. A method of fabricating a bipolar semiconductor integrated circuit device comprising the steps of:
    (a) forming a two-layered film composed of both a thin oxide film and a nitride film on the surface of an impurity doped layer of a first conductivity type which is formed on a semiconductor substrate;
    (b) forming a resist layer on a selected surface of said two-layered film, said resist layer having an overhanging cross section;
    (c) depositing a high melting metal on the surface of the structure obtained by the above step in such manner that said metal does not cover the surface of said nitride film under the overhanging portion of said resist layer;
    (d) selectively removing said two-layered film under said overhanging portion of said resist layer to expose the surface of said impurity doped layer;
    (e) depositing a semiconductor material on an entire surface of the structure obtained by the above step, said semiconductor material being deposited under said overhanging portion of said resist layer;
    (f) removing said resist layer to expose the surface of said nitride film;
    (g) implanting impurities of a second conductivity type into said semiconductor material;
    (h) oxidizing said semiconductor material layer to convert the surface of said semiconductor material layer into an oxide layer;
    (i) diffusing impurities from said semiconductor material layer to form a diffused region in said impurity doped layer;
    (j) removing said exposed nitride and oxide films to expose the surface of said impurity doped layer; and
    (k) forming a semiconductor material layer containing said first conductivity type impurities on said exposed surface of said impurity doped layer.

2. A method according to claim 1, wherein said semiconductor substrate is a silicon semiconductor substrate, said semiconductor material is a chemically vapored deposited (CVD) silicon, said first conductivity type region is N-type, and said second conductivity type region is P-type.

3. A method according to claim 2, wherein said first conductivity type impurity is arsenic, and said second conductivity type impurity is boron.

4. A method of fabricating a high density bipolar integrated circuit device comprising the steps of:
    (a) preparing a silicon semiconductor substrate having an $N^+$-type buried diffused region, an $N^-$-type collector region on a surface of said $N^+$-type buried diffused region and an $N^+$-type collector contact region on a surface of said $N^+$-type buried diffused region, said collector and collector contact regions being isolated from one another by an element isolation region;
    (b) forming a first two-layered film on the surface of said collector region and a second two-layered region, said first and second two layered films each being composed of both a thin oxide film and a nitride film;
    (c) forming a first resist layer on a selected surface of said first layered film and a second resist layer on a selected surface of said second two-layered film, said first and second layers having an overhanging cross section;
    (d) depositing a high melting metal on the surface of the structure obtained by the above step in such manner that said metal does not cover the surfaces of said nitride films under the first and second overhanging portions of said first and second resist layers;
    (e) selectively removing said first and second two-layered films under said overhanging portions of said first and second resist layers to expose the surface of said collector region and the surface of said collector contact region;
    (f) depositing a semiconductor material on an entire surface of the structure obtained by the above step, said semiconductor material being deposited under said overhanging portions of said first and second resist layers;
    (g) removing said first and second resist layers to expose the selected surfaces of said first and second two-layered films;
    (h) implanting impurities into said semiconductor material layer into a conductive layer;
    (i) selectively removing undesired portions of said conductive layer between said collector region and said collector contact region to form a base electrode;
    (j) oxidizing said conductive layer to convert the surface of said conductive layer into an oxide layer;
    (k) diffusing said impurities from said conductive layer to form a base region in said collector region;
    (l) removing the remaining first and second two-layered films to expose the surface of said base region and a surface of said collector contact region;
    (m) forming a semiconductor material layer containing impurities on said exposed base and collector contact regions;
    (n) patterning said semiconductor material layer to form an emitter electrode and a collector electrode; and
    (o) heating the structure obtained by the above step to form an emitter region in said base region through the diffusion from said emitter electrode.

5. A method according to claim 4, wherein said high melting metal is selected from the group consisting of molybdenum, tungsten and tantalum.

6. A method according to claim 4, wherein said step (f) comprises the step of depositing silicon material by a sputtering process.

* * * * *